United States Patent [19]

Yasukawa

[11] Patent Number: 4,620,158

[45] Date of Patent: Oct. 28, 1986

[54] PCM SIGNAL DEMODULATING CIRCUIT

[75] Inventor: Kenichiro Yasukawa, Saitama, Japan

[73] Assignee: Pioneer Electronic Corp., Tokyo, Japan

[21] Appl. No.: 768,381

[22] Filed: Aug. 22, 1985

[30] Foreign Application Priority Data

Aug. 22, 1984 [JP] Japan .......................... 59-127233[U]

[51] Int. Cl.⁴ ........................ H03K 9/00; H04B 14/04
[52] U.S. Cl. ...................................... 329/50; 329/104;
329/122; 360/29; 375/34; 375/94
[58] Field of Search ................. 329/50, 104, 107, 122,
329/126; 375/25, 34, 94; 360/29

[56] References Cited

U.S. PATENT DOCUMENTS 4,101,964  7/1978  Betts .................................. 375/34 X Primary Examiner—Siegfried H. Grimm
Attorney, Agent, or Firm—Sughrue, Mion, Zinn, Macpeak & Seas

[57] ABSTRACT

A PCM signal demodulating circuit in which a PCM signal corresponding to a code representative of a first sample value obtained by sampling an analog signal with a first sampling frequency is processed to obtain the first sample value, thereby to calculate a pseudo sample value equivalent to a second sample value obtained by sampling the analog signal at a second sampling frequency higher than the first sampling frequency. This is accomplished by passing the PCM signal through a digital filter, a digital-to-analog converter, and a low-pass filter connected in cascade.

3 Claims, 4 Drawing Figures

PCM SIGNAL DEMODULATING CIRCUIT

BACKGROUND OF THE INVENTION

The present invention relates to PCM signal demodulating circuits, and more particularly to a PCM signal demodulating circuit used in a digital audio system.

In a digital audio system, an audio signal is sampled at a predetermined sampling frequency to obtain sampled values. The sample values thus obtained are then digitally coded.

In these digital audio systems, a variety of coding formats and sampling frequencies are employed. For instance, in a format used in a system using a digital audio disk as the recording medium, the sampling frequency is conventionally 44.1 KHz. In a format employed in a consumer PCM processor or the like, the sampling frequency is typically 44.056 KHz. In a format employed in an operational PCM recorder or the like, the sampling frequency is usually 50 KHz or 50.4 KHz.

A plurality of different types of data sampled at different sampling frequencies as described above may be handled by a single demodulating circuit if sampling frequency conversion is carried out. The sampling frequency conversion preferably is performed in the step of converting the input signals to digital form so as to prevent deterioration of the signals. However, this method is disadvantageous in that, in order to prevent an increase in the circuit size of the demodulating circuit, the ratio of sampling frequencies before conversion must be a simple integer ratio, for instance 50.4:44.1 (=8:7).

In order to overcome this difficulty, a demodulating circuit has been proposed which is designed so that data is processed according to the sampling frequencies of the various formats and an error correcting system or the like, and the audio signal is demodulated using a single D/A (digital-to-analog) converter. However, in this demodulating circuit, if, for instance, the sampling frequency is 32 KHz, an audio signal component occurring in the output of the D/A converter and an unwanted component arising due to sampling are distributed as indicated by a solid lines a and b in FIG. 1; that is, the band of the unwanted component is higher than 16 KHz. If the sampling frequency is 44.1 KHz, the audio signal component and the unwanted component are as indicated by the broken lines c and d in FIG. 1; that is, the band of the unwanted component is higher than 22.05 KHz.

Accordingly, in order to eliminate unwanted components from the output of the D/A converter, it is necessary to provide a plurality of low-pass filters having different cut-off frequencies and to selectively operate the low-pass filters according to the sampling frequency employed. Therefore, the demodulating circuit is necessarily large in size. Furthermore, the circuit has a high manufacturing cost.

SUMMARY OF THE INVENTION

An object of this invention is to provide a simplified PCM signal demodulating circuit in which a plurality of PCM signals obtained by sampling an analog signal with different sampling frequencies are demodulated to extract the original analog signal.

The foregoing object and other objects of the invention have been achieved by the provision of a PCM signal demodulating circuit in which a PCM signal, namely, a digital signal corresponding to a code representative of a first sample value obtained by sampling an analog signal with a first sampling frequency, is processed to obtain the analog signal through demodulation, which demodulating circuit, according to the invention, is characterized by the provision of means for processing the first sample value to calculate a pseudo sample value equivalent to a second sample value obtained by sampling the analog signal with a second sampling frequency higher than the first sampling frequency.

The nature, principle and utility of the invention will become more apparent from the following detailed description when read in conjunction with the accompanying drawings.

DESCRIPTION OF THE PREFERRED EMBODIMENTS

A preferred embodiment of the invention will be described with reference to FIGS. 2 through 4.

Figure 1:
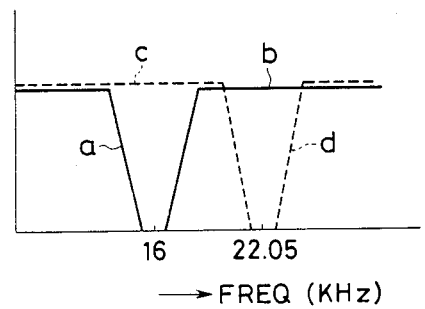
FIG. 1 is a diagram showing frequency components in the output of a D/A converter in a conventional demodulating circuit.
Figure 2:
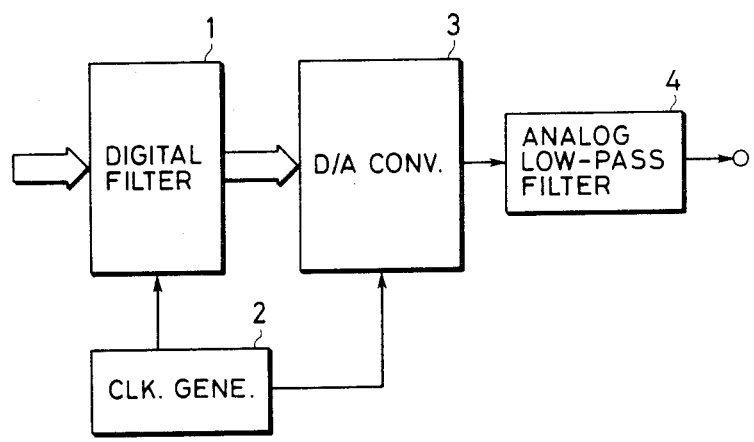
FIG. 2 is a block diagram showing an example of a PCM signal demodulating circuit according to the invention.

In FIG. 2, digital data corresponding to sample values which are obtained, for instance, from a digital audio disk player by sampling audio signals with a sampling frequency $f_s$ are successively supplied to a processing device, namely, a digital filter 1, with a period corresponding to the sampling frequency $f_s$. A system clock signal outputted by a clock generator 2 is supplied to the digital filter 1. The clock generator 2 produces a system clock signal whose frequency is, for instance, twice the sampling frequency $f_s$. The digital filter 1 is a cyclic digital filter represented by the following difference equation:

$$y(nT) = -\Sigma by(nT-T) + \Sigma ax(nT-T) \qquad (1)$$

Figure 3:
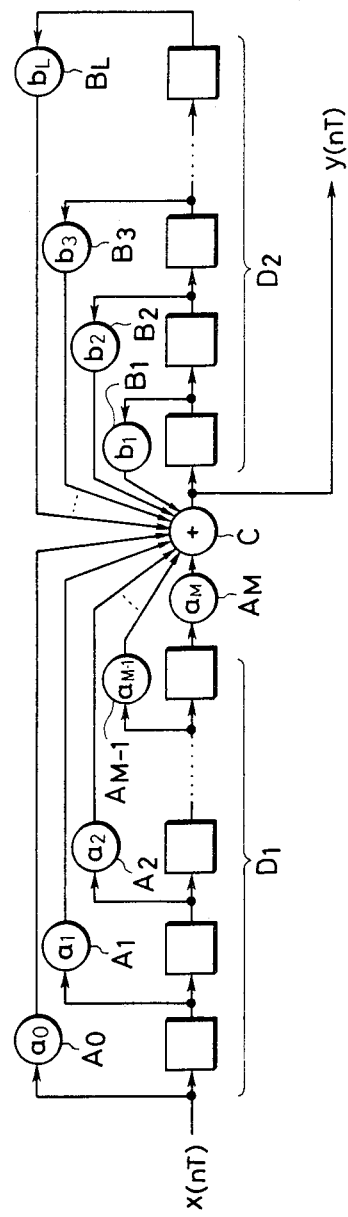
FIG. 3 is a block diagram showing the arrangement of a digital filter in the demodulating circuit of FIG. 2.

That is, the digital filter 1, as shown in FIG. 3, includes a delay circuit $D_1$ having M stages (M being a natural number) for delaying an input signal $x(nT)$ for a period of time corresponding to the period of the system clock signal, (M+1) multipliers $A_0$ through $A_M$ for weighting the input signal $x(nT)$ and the respective outputs of the stages of the delay circuit $D_1$ with factors $a_0$ through $a_M$, a delay circuit $D_2$ having L stages (L being a natural number) for delaying the output signal $y(nT)$ for a period of time corresponding to the period of the system clock signal, L multipliers $B_1$ through $B_L$ for weighting the respective outputs of the delay circuit $D_2$ with factors $-b_1, -b_2, \ldots$ and $-b_L$, and an adder C for adding the outputs of the multipliers $A_0$ through $A_M$ and $B_1$ through $B_L$ to form the output signal $y(nT)$. The output of the digital filter 1 is applied to a D/A (digital-to-analog) converter 3, to which the system clock signal is applied from the clock generator 2. In the D/A converter 3, the output of the digital filter 1 is converted into a PAM (pulse amplitude modulation) signal, i.e., a pulse train signal having an amplitude corresponding to the output data of the digital filter. The PAM signal outputted by the D/A converter 3 is applied to an analog low-pass filter 4, which provides a demodulation output.

In the circuit thus arranged, the factors $a_0$ through $a_M$ and $-b_1$ through $-b_L$ are switched so that the digital filter 1 serves as a low-pass filter with a cut-off frequency $f_s/2$. In this case, since the system clock signal supplied to the digital filter 1 has a frequency $2f_s$, the data supplied to the digital filter 1 is handled as data obtained by sampling with a sampling frequency $2f_s$. Therefore, a component is removed, which is obtained by removing from the unwanted component higher than the cut-off frequency $f_s/2$ a component corresponding to the unwanted component, which is obtained by sampling an audio signal of frequency lower than $f_s/2$ at the sampling frequency $2f_s$, as a result of which digital data is obtained which corresponds to a pseudo sample value equivalent to the sample value which is obtained by sampling the audio signal with the sampling frequency $2f_s$.

Figure 4:
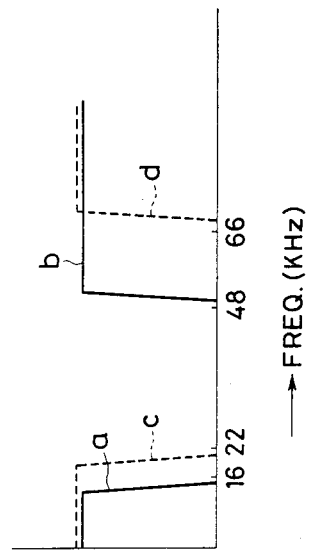
FIG. 4 is a diagram showing frequency components in the output of a D/A converter in the demodulating circuit of the invention.

Accordingly, in the case where the sampling frequency for digital data applied to the digital filter 1 is 32 KHz, the D/A converter 3 provides a PAM signal consisting of an audio signal component lower than 16 KHz, as indicated by the solid line a in FIG. 4, and an unwanted component higher than 48 KHz, as indicated by the solid line b. In the case where the sampling frequency for digital data supplied to the digital filter 1 is 44.1 KHz, the D/A converter 3 outputs a PAM signal consisting of an audio signal component lower than 22 KHz, as indicated by the broken line c in FIG. 4, and an unwanted component higher than 66 KHz, as indicated by the broken line d.

As is apparent from the above description, if a single filter having a cut-off frequency 22 KHz is employed as the analog low-pass filter 4, then the unwanted component can be eliminated, not only in the case where the sampling frequency is 32 KHz, but also where it is 44.1 KHz.

The case where the sampling frequencies $f_s$ are 32 KHz and 44.1 KHz has been described. However, it should be noted that other cases where the sampling frequencies are other than 32 KHz and 44.1 KHz can be similarly dealt with merely by changing the factors of the digital filters.

As is clear from the above description, the PCM signal demodulating circuit according to the invention is designed so that a PCM signal corresponding to a code representative of a first sample value obtained by sampling an analog signal at a first sampling frequency is processed to provide the first sample value, thereby to calculate a pseudo sample value equivalent to a second sample value obtained by sampling the analog signal at a sampling frequency higher than the first sampling frequency, and a digital signal corresponding to a code representative of the second sample value is subjected to D/A conversion to obtain an analog original signal. Therefore, by sufficiently spacing the band of the analog original signal component in the signal obtained after D/A conversion from the band of the unwanted component obtained through sampling, the unwanted component can be removed with a single low-pass filter in any case in which different sampling frequencies are employed. Accordingly, the PCM signal demodulating circuit of the invention is small in size and can be readily miniaturized. Therefore, it can be manufactured at a low cost.

I claim:

1. In a PCM signal demodulating circuit comprising means for processing a PCM signal including a digital signal corresponding to a code representative of a first sample value obtained by sampling an analog signal at a first sampling frequency to obtain said analog signal through demodulation, the improvement wherein said PCM signal demodulating circuit further comprising: means for processing said first sample value to calculate a pseudo sample value equivalent to a second sample value obtained by sampling said analog signal at a second sampling frequency higher than said first sampling frequency.

2. The PCM signal demodulating circuit of claim 1, wherein said processing means comprises a digital filter, a digital-to-analog converter having an input coupled to an output of said digital filter, an analog low-pass filter having an input coupled to an output of said digital-to-analog converter, and means for supplying clock pulses to said digital filter and said digital-to-analog converter.

3. The PCM signal demodulating circuit of claim 2, wherein said digital filter functions as a low-pass filter having a cut-off frequency substantially one-fourth a frequency of said clock pulses.

* * * * *